United States Patent [19]

Pass

[11] Patent Number: 5,710,522
[45] Date of Patent: Jan. 20, 1998

[54] AMPLIFIER HAVING AN ACTIVE CURRENT SOURCE

[75] Inventor: Nelson S. Pass, Foresthill, Calif.

[73] Assignee: Pass Laboratories, Inc., Foresthill, Calif.

[21] Appl. No.: 679,833

[22] Filed: Jul. 15, 1996

[51] Int. Cl.$^6$ ........................................... H03F 1/34
[52] U.S. Cl. ................................ 330/291; 330/296
[58] Field of Search ............................. 330/290, 291, 330/293, 296, 300

[56] References Cited

U.S. PATENT DOCUMENTS

| | | | |
|---|---|---|---|
| 5,068,623 | 11/1991 | Camin et al. | 330/296 X |
| 5,343,166 | 8/1994 | Pass | 330/264 |
| 5,365,199 | 11/1994 | Brooks | 330/291 |
| 5,382,919 | 1/1995 | Lawton | 330/29 X |
| 5,412,309 | 5/1995 | Ueunten | 323/316 |

*Primary Examiner*—Steven Mottola
*Attorney, Agent, or Firm*—Thomas Schneck; George B. F. Yee

[57] ABSTRACT

The present invention is a single-ended Class A gain stage amplifier consisting of an active current source. A feedback path from an output node of the amplifier senses the direction and magnitude of the current going through a load coupled to the output node. The feedback path varies the output of the active current source in accordance with the sensed load current. By so doing, the efficiency of the amplifier of the present invention can be doubled as compared to prior art amplifiers operating in Class A mode. In addition, the present invention amplifier exhibits lower signal distortion.

23 Claims, 7 Drawing Sheets

AMPLIFIER HAVING AN ACTIVE CURRENT SOURCE

TECHNICAL FIELD

The present invention relates generally to amplifiers, and more specifically to single-ended Class A amplifiers using an active current source.

BACKGROUND ART

An amplifying system usually consists of several stages in cascade. The front-end stages in the amplification chain operate in a small-signal environment, and so signal quality is easily maintained because the active devices operate well within their linear regions. The output stage, however, feeds a transducer such as a cathode-ray tube, a servomotor, a loudspeaker, etc., and hence must be capable of delivering a large current or voltage. In the case of audio amplifiers, there is the additional constraint of maintaining high quality in the final output signal.

Class A amplifiers reproduce the input signal with the greatest fidelity. However, this is accomplished at the expense of poor power efficiency, meaning that the output signal delivered to the load, namely the speakers, is usually a small fraction of the dc power supplied to the amplifier. The remainder is dissipated as heat. The theoretical maximum efficiency of a Class A amplifier is fifty percent. However, typical efficiencies are on the order of twenty-five to forty percent.

Typical single-ended Class A amplifier configurations are shown in FIGS. 6A–6D. The single-ended gain stage shown in FIG. 6A consists only of an amplifying element 10 biased by a resistor 20. Here, the amplifying element is an N-channel MOSFET. The efficiency of this amplifier is approximately eight percent.

Figure 6A:
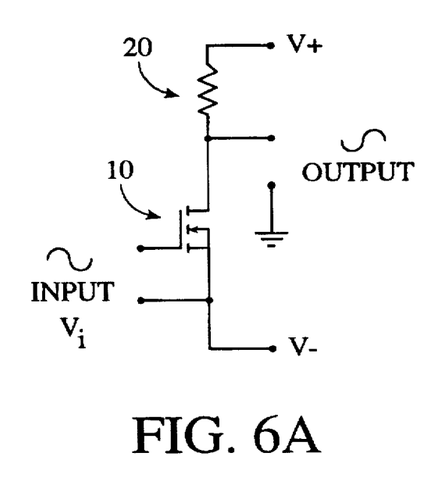
FIGS. 6A–6D show various prior art amplifiers.
Figure 6B:
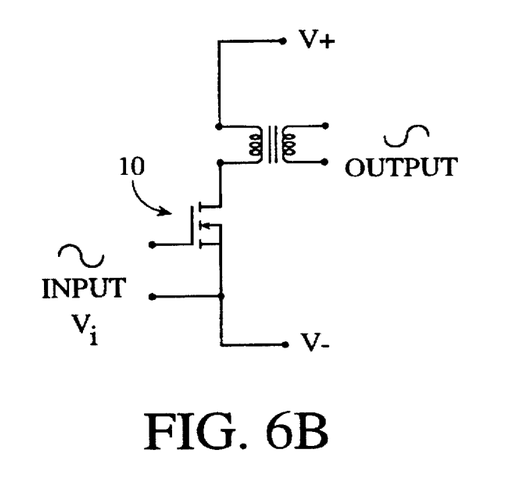
Figure 6C:
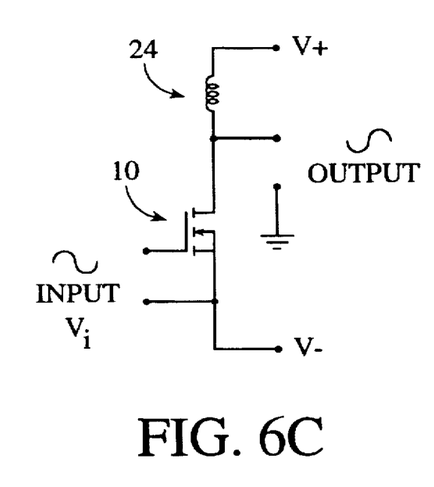

The circuit of FIG. 6B shows an input gain device 10 that is biased through a coupling transformer 22. This circuit approaches fifty percent efficiency, but has limited bandwidth and is therefore not appropriate for high fidelity audio applications. In addition, the dc current flowing through the primary of the transformer saturates the transformer core and distorts the amplified signal. The circuit shown in FIG. 6C also approaches fifty percent operating efficiency, but also exhibits the same bandwidth limitations and distortion problems experienced by the transformer coupled circuit of FIG. 6B.

Figure 6D:
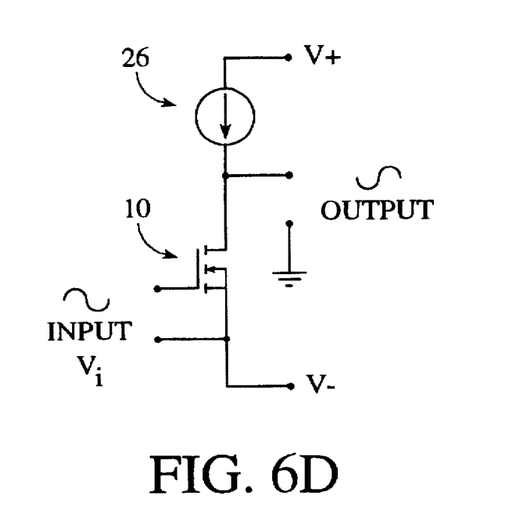

FIG. 6D shows an input gain device 10 biased by a constant current source 26. This circuit exhibits superior bandwidth and low distortion characteristics. The maximum theoretical efficiency for this circuit is twenty-five percent. However, typical efficiencies are less.

What is needed is an amplifier which offers high bandwidth and low distortion characteristics, and which operates at high efficiency.

SUMMARY OF THE INVENTION

In accordance with the teachings of the present invention, an amplifier employs an active current source as a dynamic element for biasing an input gain device of the amplifier. The positive and negative going swings of an input signal control the input gain device. Thus, the input gain device either sinks output current of the current source or directs the output current through an output node to drive a load coupled to the amplifier. In addition to sinking output current from the current source, the input gain device also sinks current drawn from the load.

A current sensing resistor disposed at the output node senses the magnitude and direction of the load-driving current. The sensed current flow provides a feedback signal to the current source to control the amount of current generated by the current source. Thus, when current is being drawn from the load, the output of the current source is decreased. Conversely, when the load is being driven, the current source increases its output to provide a drive current. In this way, the variation in current going through the input gain device is only a fraction of the output current.

The amplifier of the present invention can be used as a single gain stage or as one of a series of two or more gain stages.

BEST MODE FOR CARRYING OUT THE INVENTION

Figure 1:
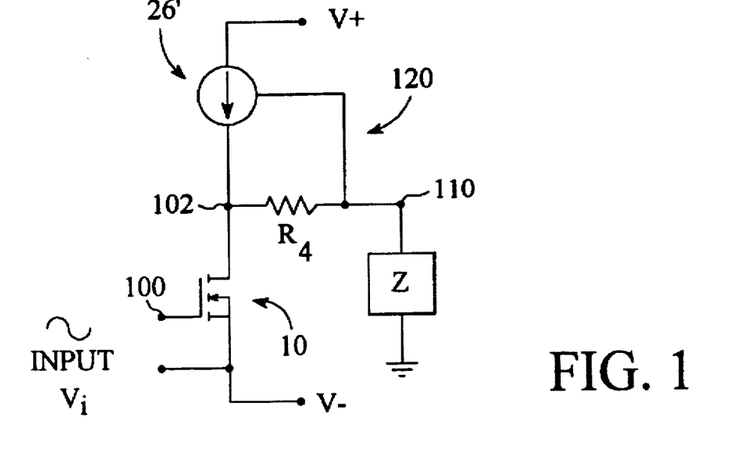
FIG. 1 shows a general representation of the present invention.

FIG. 1 shows a schematic representation of an amplifier of the present invention. The amplifier includes an input gain device 10, a variable current source 26' and a load-current sensing resistor $R_4$. The input gain device 10 is biased by the variable current source 26' and receives an input signal from an input node 100 coupled to the control terminal of the gain device. The amplifier output drives an external load Z which is coupled to an output node 110 of the amplifier through the load-current sensing resistor $R_4$.

In operation, as the input signal swings negative, the input gain device 10 become increasingly less conductive. This directs an increasing portion of the current produced by the variable current source 26' through the load Z. As the input signal swings positive, the input gain device 10 becomes increasingly more conductive, sinking an increasing portion of the current produced by the current source 26'. In addition, current is drawn from the load Z and sunk through the input gain device 10.

The load-current sensing resistor $R_4$ senses the direction and magnitude of the current passing through the output node 110. This serves as a signal that is fed back 120 to the current source 26' to control the amount of current it produces. Specifically, the output current of the current source 26' decreases in proportion to the magnitude of current flowing from the load Z to the input gain device 10. Since the input gain device sinks current from both the current source 26' and the load Z, the effect of the operation of the current source is to decrease the amount of current that the input gain device must sink during the positive going portions of the input signal. Conversely, the output current of the current source 26' increases in proportion to the magnitude of current flowing to the load Z. Thus, during the negative going portions of the input signal, the current source provides proportionately increasing amounts of drive current to the load Z. In this manner, the peak-to-peak current variation experienced by the input gain device is only a fraction of the current flowing through the output node 110 of the amplifier.

Figure 2:
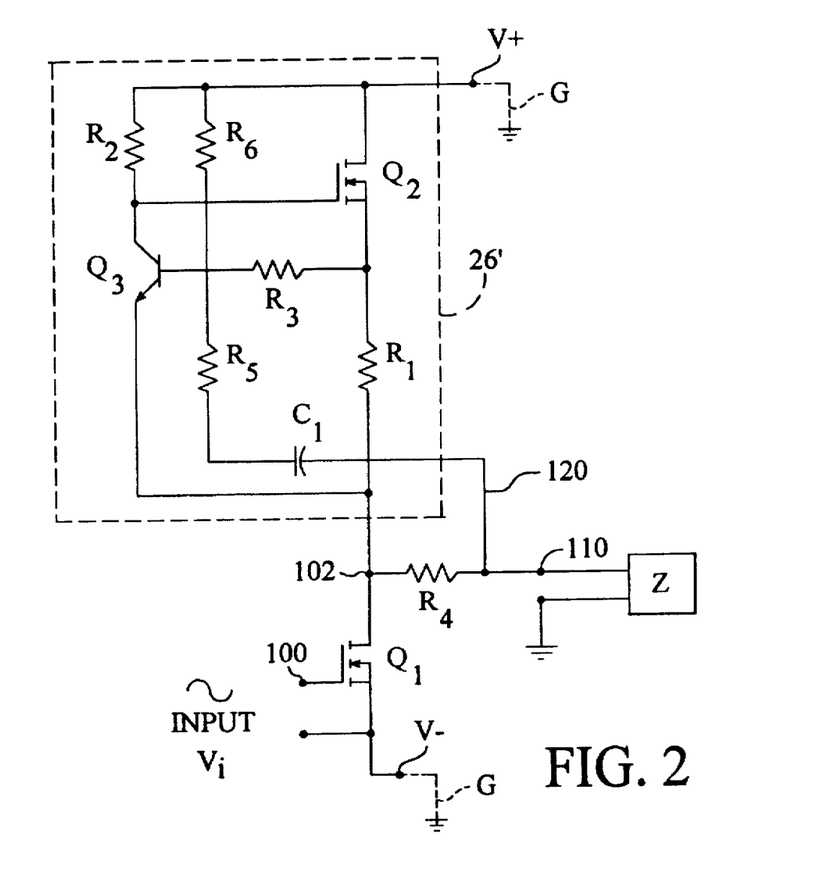
FIG. 2 depicts an embodiment of the amplifier of the present invention.

Turning now to FIG. 2, a preferred embodiment of the amplifier in accordance with the present invention is shown. An input node 100 is coupled to the control gate of an N-channel input MOSFET $Q_1$. The drain of $Q_1$ is coupled to an output node 110 through an output resistor $R_4$. As will be explained below, the output resistor $R_4$ senses the direction and magnitude of the current passing through the load Z.

The variable current source 26' is coupled to the drain of $Q_1$ at the current node 102. The current source 26' includes an N-channel MOSFET $Q_2$ having a drain coupled to a positive voltage rail V+. Current through $Q_2$ flows from the voltage rail between the drain and source terminals of $Q_2$ and through a sensing resistor $R_1$ to the current node 102. The current source 26' further includes an NPN bipolar junction transistor $Q_3$. The base and emitter terminals of $Q_3$ are coupled via a resistor % to the sensing resistor $R_1$ to sense a voltage drop across $R_1$. The collector of $Q_3$ is coupled directly to the control gate of $Q_2$, and to the positive rail V+ through a pull-up resistor $R_2$. A feedback resistor $R_5$ couples the base of $Q_3$ to the output node 110 of the amplifier. The current source 26' may include a dc-blocking capacitor $C_1$ and a dc-biasing resistor $R_6$, both of which will be discussed below in further detail.

The operation of the variable current source 26' will be explained with reference to FIG. 2. Ignoring for the moment resistors $R_4$ and $R_5$, the current through $Q_2$ is operated at a constant current by means of the feedback loop formed by $Q_3$ and resistors $R_1$–$R_3$. Current flowing through $Q_2$ is sensed across $R_1$. The potential across $R_1$ drives the base-emitter junction of $Q_3$, and as the voltage across $R_1$ reaches about 0.7 V, $Q_3$ turns on, limiting the drive of the gate of $Q_2$.

Consider now the addition of the load-current sensing resistor $R_4$ and the feedback resistor $R_5$. During a negative swing of the input signal, $Q_1$ begins to turn off, thereby shunting current from $Q_2$ of the current source 26' to the output node 110. The amplifier output signal begins to swing positive and current flows through the output resistor $R_4$ to the load Z. The voltage drop which develops across $R_4$ is such that the potential at the current node 102 becomes increasingly greater than the potential at the output node 110. This increases the reverse bias of the base-emitter junction of $Q_3$, resulting in a decrease in the conduction of current through $Q_3$. The collector voltage of $Q_3$ which drives $Q_2$ begins to go positive, thus increasing the current through $Q_2$ and consequently to the load Z.

In this manner, part of the current to the load is provided by an increase in current through $Q_2$. This portion is referred to as the "current gain setting" of the circuit, which can range from 0 to approaching 1. The proportions of variations in the current through $Q_2$ versus the output current is approximately:

$$\frac{R_4 \cdot R_3}{R_1 \cdot R_5}$$

Although the gain setting can be set to an arbitrary value between 0 and 1, the preferred setting for typical Class A amplification is 0.5. For example, the ratios of $R_1$ to $R_4$ and $R_5$ to $R_3$ can be selected such that variations in the current of $Q_2$ source half of the current to the load, for a desired current gain setting of 0.5. This allows the circuit to approach fifty percent efficiency, which is twice the performance obtained by a constant current source amplifier such as the one shown in FIG. 6D. For example, a 0.5 current gain setting may be achieved by selecting equal valued resistors for $R_3$ and $R_5$ and having $R_4$ being one-half the resistance of $R_1$.

During a positive swing of the input signal, $Q_1$ begins to conduct. $Q_1$ sinks current drawn from the load Z through the resistor $R_4$. $Q_1$ also sinks current originating from the current source 26'. Current flowing through the resistor $R_4$ creates a voltage differential across $R_4$ which forward biases the base-emitter junction of $Q_3$ to increase the conductivity of $Q_3$. As a result, the voltage at the collector of $Q_3$ decreases, bringing down the gate voltage of $Q_2$ so that $Q_2$ starts to conduct less current. $Q_3$ thus can be viewed as a variable biasing transistor which controls the output of $Q_2$.

It can be seen that the current source 26' of the present invention varies its current output in response to the magnitude and direction of the current flowing through the load Z. In so doing, the current load experienced by the input transistor $Q_1$ of the present invention amplifier is less than that of the prior art amplifiers. The efficiency of the amplifier of the present invention is improved, and since the current swings through $Q_1$ fall within a smaller region of the operating curve, performance is improved.

Figure 3A:
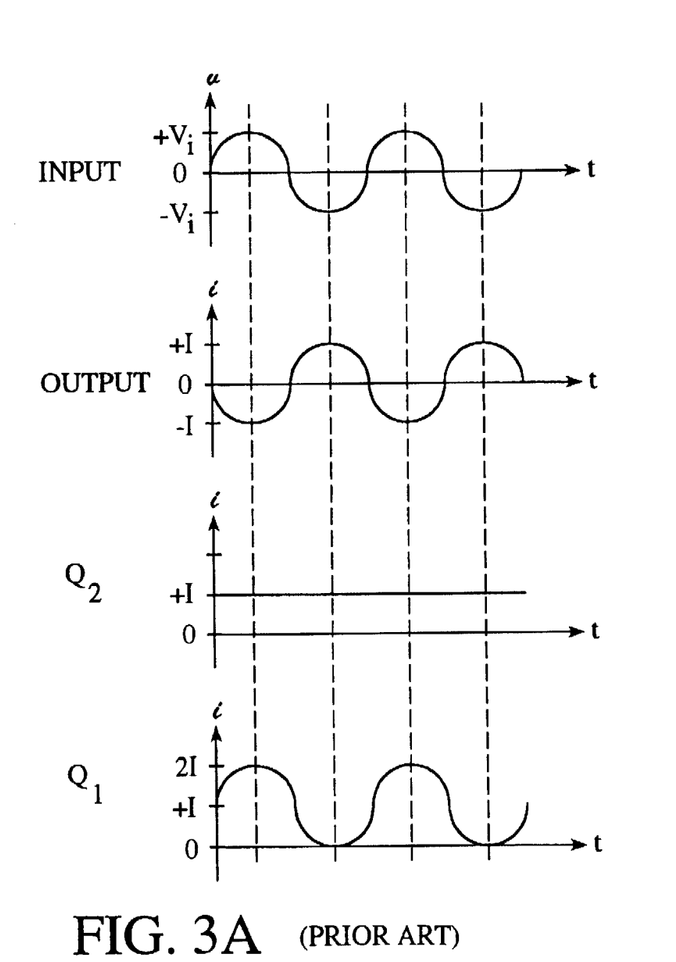
FIGS. 3A and 3B are signal waveforms showing the operation of the prior art amplifier and of the present invention amplifier.
Figure 3B:
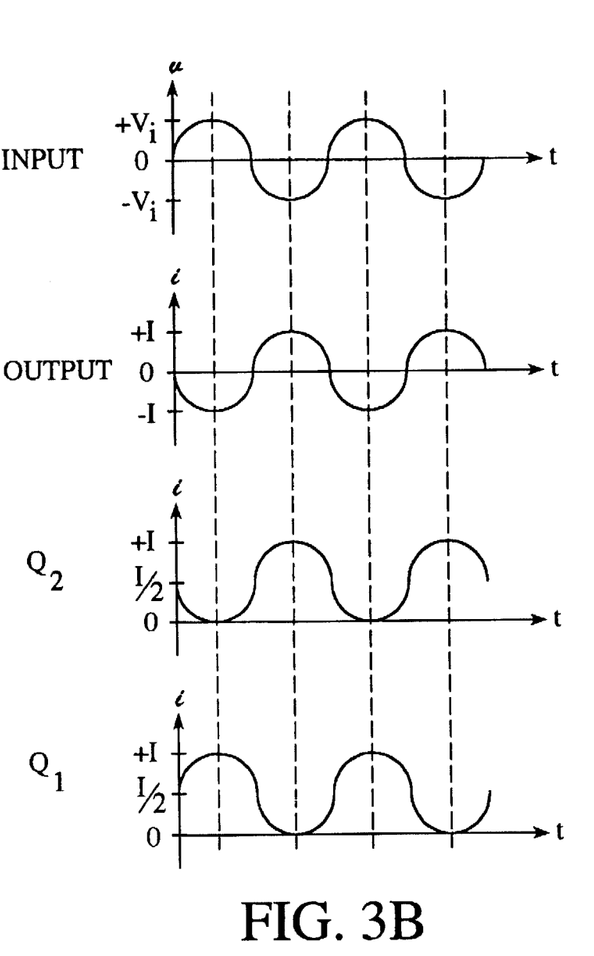

The waveforms shown in FIGS. 3A and 3B more clearly illustrate the improvements in the power efficiency and performance of the present invention amplifier over that of the prior art amplifier. Consider first the prior art amplifier shown in FIG. 6D and its corresponding waveforms shown in FIG. 3A. The input waveform represents the input voltage $V_i$, measured relative to V–, applied to the gate of $Q_1$, and is shown to vary between +$V_i$ and –$V_r$. The output waveform represents the current through a load (not shown in FIG. 6D) coupled to the output. As the input voltage $V_i$ rises above 0 V, $Q_1$ becomes more conductive, resulting in a current flow from the load to V– through $Q_1$. This negative current flow is shown in FIG. 3A as the negative going portions of the output waveform.

Continuing, the prior art circuit includes a constant current source of which $Q_2$ is a part. The $Q_2$ waveform in FIG. 3A therefore shows a constant current level of +I. The $Q_1$ current waveform varies from 0 A to +2I A. Recall that as the input voltage swings positive, the conductance through $Q_1$ increases and current is drawn from the load to $Q_1$. However, $Q_1$ also sinks current sourced from the constant current source, namely the current flowing through $Q_2$. Thus, at its maximum conductance, $Q_1$ will sink +2I A of current. Conversely when the input voltage swings negative, $Q_1$ begins to turn off, thus shunting some of the $Q_2$ current to the load, until the conductance of $Q_1$ becomes zero at which point all of the current from $Q_2$ goes to the load.

Turn now to the waveforms of the present invention amplifier shown in FIG. 3B. It is noted that the waveforms represent a current source having a current gain setting of 0.5. The input voltage waveform and the output current waveform are as described above. The current through $Q_2$ of the invention tracks the output current flowing through the load Z. By contrast, the $Q_2$ current of the prior art amplifier is constant. As can be seen in FIG. 3B, since the gain setting is set at 0.5, the quiescent current through $Q_2$ is +0.5I A. As the input voltage swings negative, the current through the load Z increases to a maximum of +I A, as does the $Q_2$ current. Conversely, as the input voltage goes positive, the current through the load reverses and reaches a peak at –I A, at which point the $Q_2$ current becomes 0 A. In the quiescent state, the average current flow through $Q_2$ of the present invention is 0.5I A, as compared to the average current flow of the prior art $Q_2$, which is I amps. For Class A operation, it is conventional to speak of quiescent values, since the amplifier always draws current even when there is no signal. Thus, the amplifier of the present invention consumes one-half the power consumed by the prior art amplifier, and therefore operates at twice the efficiency.

Referring again to FIG. 3B, the $Q_1$ current swing is shown to be between 0 A and +I A, which is one-half the current swing of the prior art $Q_1$ current swing shown in FIG. 3A. The reason is that the $Q_2$ current varies with the magnitude and direction of the current going through the load Z. As an increasing amount of current flows from the load Z to $Q_1$, the $Q_2$ current decreases in the manner described above until $Q_2$ is turned off, so that $Q_1$ is subject to at most I amps of current. The lower current swing through $Q_1$ maintains the operating range of the device within a smaller region of its operating curve, and therefore $Q_1$ exhibits better performance such as improved gain and lower distortion.

Returning to the preferred embodiment shown in FIG. 2, the circuit includes the dc-blocking capacitor $C_1$ in series with resistor $R_5$. Although the capacitor is not needed for operation of the present invention, its use facilitates adjustment of the current gain setting of the amplifier. The presence of $C_1$ allows the gain setting to be selected simply by adjusting one of the resistor values (e.g. $R_5$) shown in Eqn. 1 without altering the DC bias values of the circuit. Resistor coupled between the V+ voltage rail and the base of lowers DC current through $R_1$ needed to produce 0.7 V at the base of $Q_3$. Typically, $R_6$ will be selected to produce about 0.4 to 0.5 V, reducing the losses through the circuit by allowing for a lower value for $R_1$.

Figure 4A:
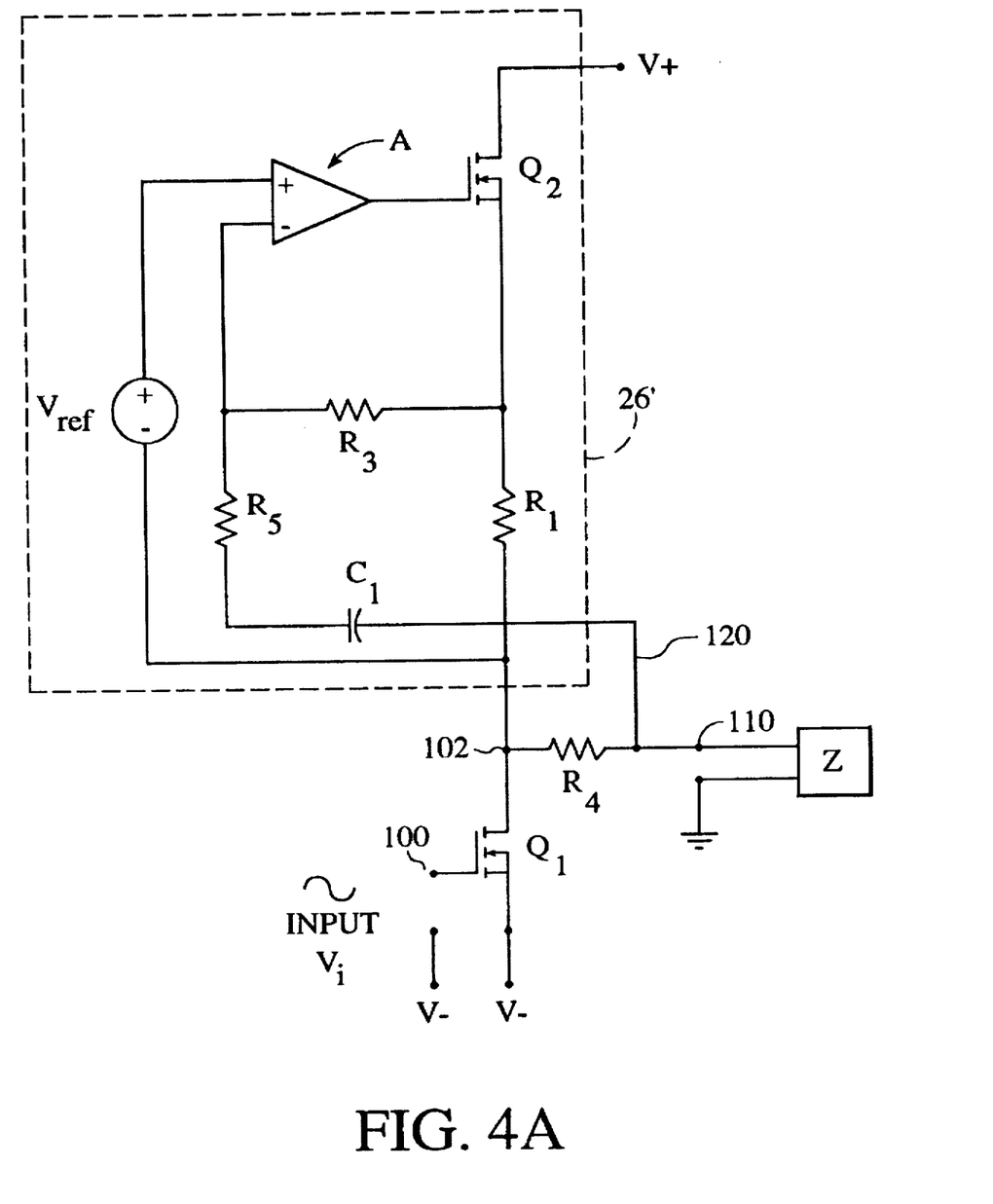
FIGS. 4A–4C show alternate embodiments of the present invention.
Figure 4B:
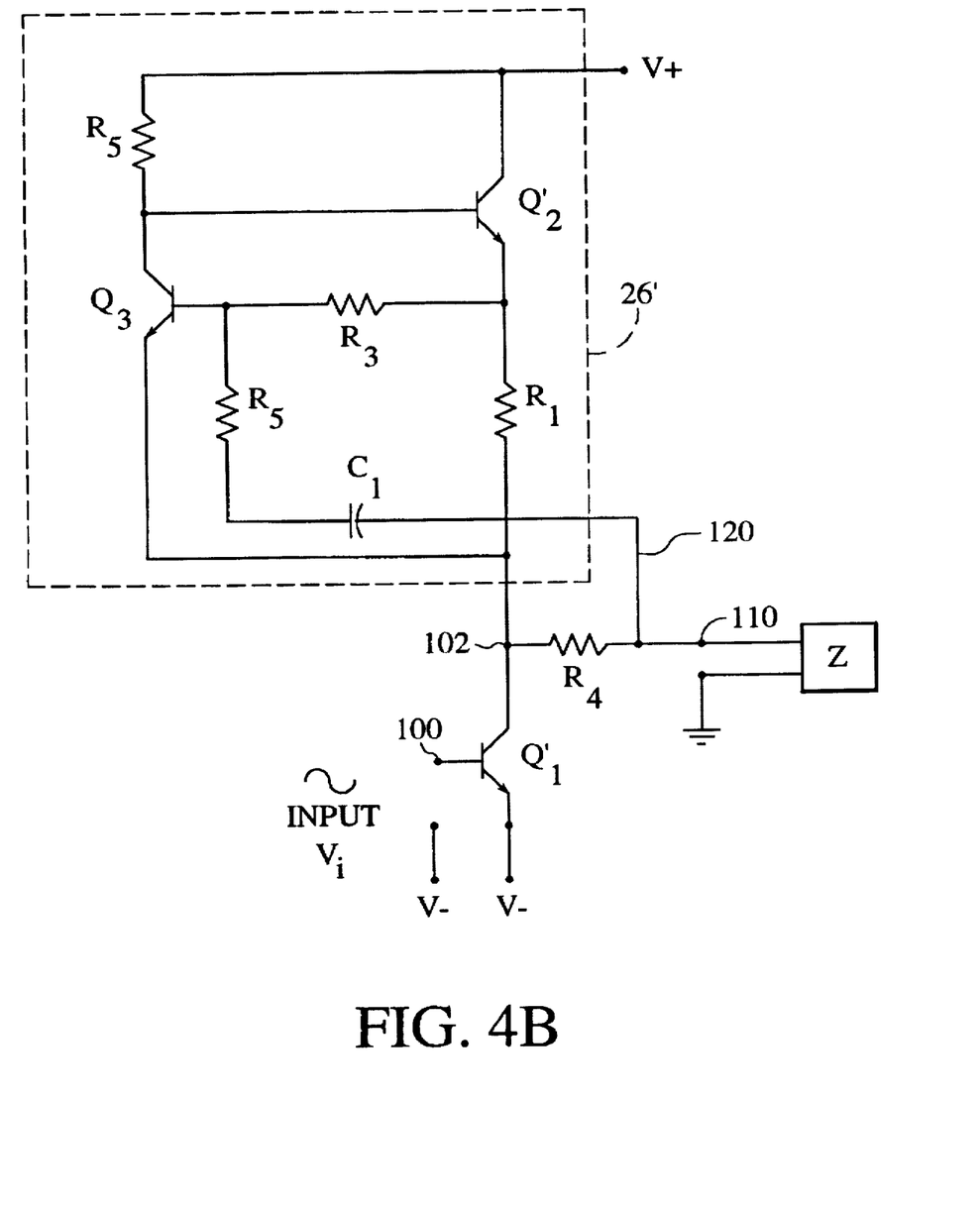
Figure 4C:
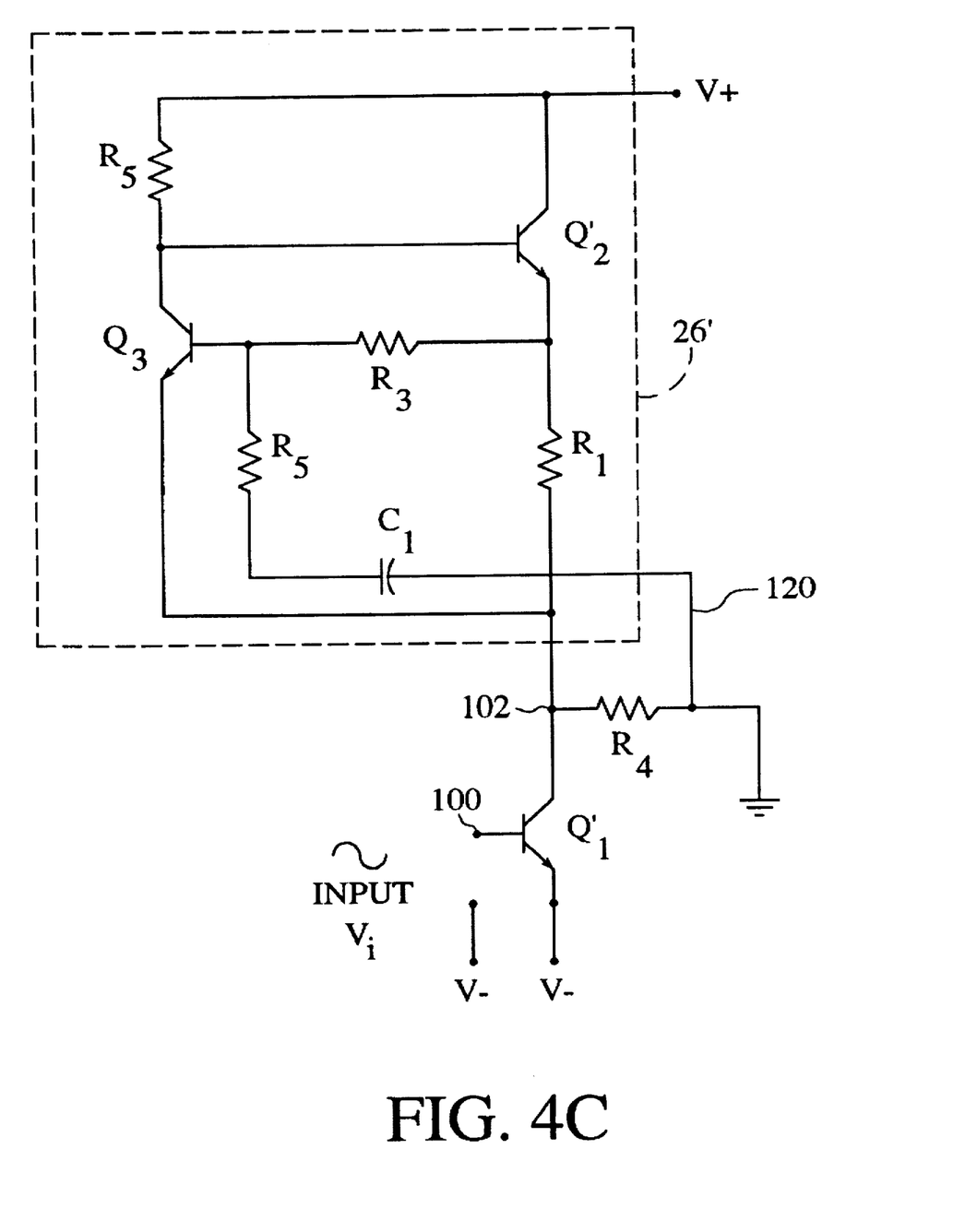

Turning to FIGS. 4A, 4B and 4C, alternate embodiments of the present invention are shown. FIG. 4A shows the use of an operational amplifier A, in place of $Q_3$ (FIG. 2), as a variable bias for controlling the current source 26'. A separate voltage reference $V_{ref}$ serves as a bias reference for $Q_2$. Although the present invention can be implemented with an op-amp, the use of a transistor such as $Q_3$ in FIG. 2 is a more elegant approach over an op-amp. $Q_3$ is a simpler device, and it provides its own bias reference in the form of the base-emitter junction.

FIG. 4B shows the use of bipolar junction transistors (BJT) $Q_1'$ and $Q_2'$ in place of the MOSFET's shown in FIG. 2. Moreover, either or both of the MOSFET's of FIG. 2 can be replaced with BJT devices. Generally speaking, any gain device can be used in place of $Q_1$ and $Q_2$, for example vacuum tubes, without departing from the scope and spirit of the present invention. FIG. 4C shows an embodiment where $R_4$ is the load itself, with node 110 grounded.

Figure 5:
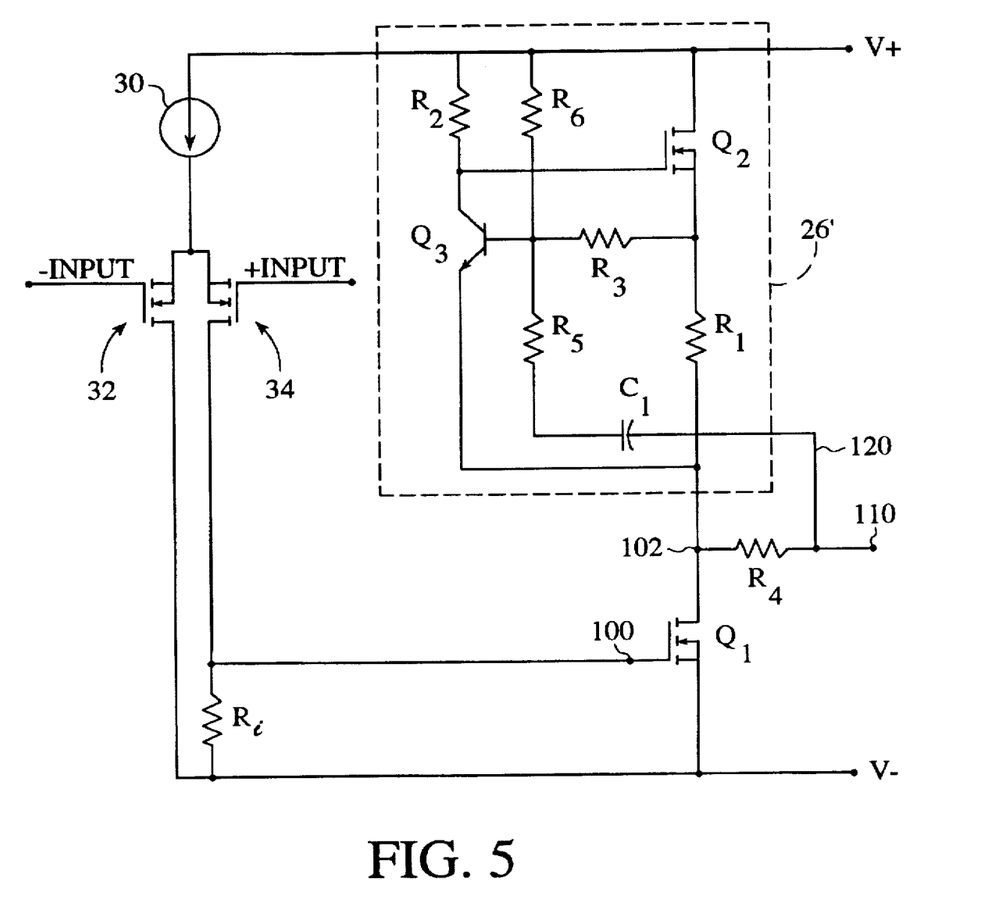
FIG. 5 illustrates the present invention as used in a multiple gain stage application.

The configuration of FIG. 2 is a single-ended gain stage. FIG. 5 shows the present invention in a two gain stage configuration. The first stage is a differential stage consisting of two transistors 32, 34 driven by a current source 30. The input to the second stage is taken from the voltage drop across an input resistor $R_i$.

Although the power supply configuration shown in FIG. 2 uses a positive power rail to negative rail, alternate power supply arrangements are contemplated. For example, FIG. 2 shows in phantom the V+ node can be coupled to a ground rail G with the V− node being maintained at a negative potential. Alternatively, the V− node can be coupled to a ground rail G (also shown in phantom in FIG. 2) with the V+ node being maintained at a positive potential.

I claim:

1. An amplifier for amplifying an input signal comprising:
   a signal input node for receiving said input signal;
   a signal output node;
   an input gain device having a control pin coupled to said signal input node, and further having first and second terminals for current flow therebetween;
   a load-current sensing resistor coupled between said first terminal of said input gain device and said signal output node;
   a first reference voltage terminal coupled to said second terminal of said input gain device for current flow between said signal output node and said first reference voltage terminal;
   an active current source having an current output terminal coupled to said first terminal of said input gain device for current flow from said active current source to each of said signal output node and said first reference voltage terminal; and
   a feedback path, coupled between said signal output node and said active current source, for detecting the magnitude and direction of current flow through said load-current sensing resistor;
   said active current source further having a quiescent current flow in the absence of current flow through said load-current sensing resistor;
   said active current source further having a first current flow greater than said quiescent current flow by an amount proportional to the magnitude of a current flow between said load-current sensing resistor and said signal output node flowing in a first direction;
   said active current source further having a second current flow less than said quiescent current flow by an amount proportional to the magnitude of a current flow between said load-current sensing resistor and said signal output node flowing in a second direction.

2. The amplifier of claim 1 wherein said active current source further includes:
   a gain device having a control pin and first and second terminals for current flow between said terminals, said first terminal being in electrical communication with said current output terminal;
   a second voltage terminal coupled to said second terminal of said gain device for current flow between said first and second terminals of said gain device; and
   a variable bias means coupled to said control pin of said gain device for biasing said gain device;
   said variable bias means being in electrical communication with said feedback path and being controlled thereby;
   whereby said gain device is biased in response to the magnitude and direction of current flowing through said load-current sensing resistor to produce said quiescent current flow, said first current flow and said second current flow.

3. The amplifier of claim 2 wherein said variable biasing means includes:
   a biasing transistor having a control pin and first and second terminals, said first terminal of said biasing transistor being coupled to said control pin of said gain device, said second terminal of said biasing transistor being coupled to said current output terminal;
   a first resistor coupled between said control pin of said biasing transistor and said first terminal of said gain device; and
   a second resistor coupled between said first terminal of said biasing transistor and said second voltage reference terminal;

said feedback path being connected only to said control pin of said biasing transistor.

4. The amplifier of claim 3 wherein said feedback path includes a series-coupled resistor.

5. The amplifier of claim 3 wherein said feedback path includes a series-coupled resistor connected in series with a dc-blocking capacitor.

6. The amplifier of claim 3 wherein said variable biasing means further includes a third resistor coupled between said second voltage reference and said control terminal of said biasing transistor.

7. The amplifier of claim 3 wherein said input gain device and said gain device each are field effect transistors, and said biasing transistor is a bipolar junction transistor.

8. The amplifier of claim 3 wherein said input gain device and said gain device and said biasing transistor each is a bipolar junction transistor.

9. The amplifier of claim 2 wherein said variable biasing means is an op-amp having an output coupled to said control pin of said gain device.

10. An amplifier comprising:
a signal input terminal for receiving an input signal;
a signal output terminal for providing an output signal;
a first voltage rail for connection to a first voltage potential and a second voltage rail for connection to a second voltage potential;
a first transistor having a first electrode coupled to said first voltage rail, and further having a second electrode and a control electrode;
a second transistor having a first electrode, a second electrode coupled to said second voltage rail, and a control electrode coupled to said signal input terminal;
a first resistor coupled between said first transistor and said second transistor;
an output resistor having a first end coupled to said second electrode of said first transistor and a second end coupled to said signal output terminal;
a biasing transistor having a first terminal coupled to said control terminal of said first transistor, a second terminal coupled to said first end of said output resistor, and a control terminal;
a pull-up resistor connected between said first voltage rail and said first terminal of said biasing transistor;
a second resistor coupled between said control terminal of said biasing transistor and second terminal of said first transistor; and
a third resistor coupled between said control terminal of said biasing transistor and said signal output terminal.

11. The amplifier of claim 10 further including a biasing resistor coupled between said first voltage rail and said control terminal of said biasing transistor.

12. The amplifier of claim 10 wherein said first and second transistors each is an NPN bipolar junction transistor.

13. The amplifier of claim 10 wherein said first and second transistors each is an N-channel FET, and said biasing transistor is an NPN bipolar junction transistor.

14. The amplifier of claim 10 wherein said first and second transistors each is a P-channel FET, and said biasing transistor is a PNP bipolar junction transistor.

15. The amplifier of claim 10 wherein said first voltage rail is coupled to ground potential.

16. The amplifier of claim 10 wherein said second voltage rail is coupled to ground potential.

17. The amplifier of claim 10 wherein said first and second voltage rails are of opposite polarities.

18. The amplifier of claim 10 further including an amplifier gain stage having an output coupled to said signal input terminal.

19. A method of operating an amplifier comprising the steps of:
generating a first current flow;
directing a portion of said first current flow through each of a first gain device and an output node;
on a control electrode of said first gain device, receiving a time varying input signal having positive and negative voltage swings;
during a negative voltage swing of said input signal, reducing the conductance of said first gain device, thereby increasing said portion of said first current flow through said output node;
during a positive voltage swing of said input signal, sinking a second current flow flowing from said output node to said first gain device;
sensing an increase in said portion of said first current flow through said output node;
in response to said sensing said increase, increasing the magnitude of said first current flow in proportion to the magnitude of said sensed increase;
sensing said second current flow; and
in response to said sensing said second current flow, reducing the magnitude of said first current flow in proportion to the magnitude of said sensed second current flow.

20. The method of claim 19 wherein said step of sensing said second current flow includes blocking dc components of said second current flow.

21. The method of claim 19 wherein said step of generating a first current includes operating a second gain device to generate said first current.

22. The method of claim 21 wherein said operating said gain device includes biasing said second gain device in response to said sensing an increase and said sensing said second current flow.

23. The method of claim 22 wherein said operating said gain device further includes biasing said gain device for operation in Class A mode.

* * * * *

UNITED STATES PATENT AND TRADEMARK OFFICE
CERTIFICATE OF CORRECTION

PATENT NO  : 5,710,522
DATED      : Jan. 20, 1998
INVENTOR(S): Nelson S. Pass

It is certified that error appears in the above-identified patent and that said Letters Patent is hereby corrected as shown below:

Col. 3, line 19, "resistor % to" should read -- resistor $R_3$ to --.

Col. 5, line 26, "Resistor coupled" should read -- Resistor $R_6$, coupled --.

Col. 5, lines 26-27, "base of lowers" should read -- base of $Q_3$, lowers --.

Signed and Sealed this

Thirty-first Day of March, 1998

Attest:

BRUCE LEHMAN

Attesting Officer

Commissioner of Patents and Trademarks